United States Patent
Shin et al.

(10) Patent No.: US 7,459,736 B2
(45) Date of Patent: Dec. 2, 2008

(54) FERROELECTRIC CAPACITOR AND FERROELECTRIC MEMORY WITH IR-RU ALLOY ELECTRODE AND METHOD OF MANUFACTURING THE SAME

(75) Inventors: Sang-min Shin, Gyeonggi-do (KR); Suk-pil Kim, Gyeonggi-do (KR); Young-soo Park, Gyeonggi-do (KR); Jung-hyun Lee, Gyeonggi-do (KR); June-mo Koo, Seoul (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 10/978,795

(22) Filed: Nov. 2, 2004

(65) Prior Publication Data

US 2006/0022236 A1    Feb. 2, 2006

(30) Foreign Application Priority Data

Jul. 28, 2004    (KR)    ...................... 10-2004-0059399

(51) Int. Cl.
*H01L 29/76*    (2006.01)
*H01L 29/94*    (2006.01)

(52) U.S. Cl. ....................................... 257/295; 257/306
(58) Field of Classification Search ................. 257/295, 257/296, 301, 303, 304, 306, 309, 311, 31
See application file for complete search history.

(56) References Cited

U.S. PATENT DOCUMENTS

| | | | |
|---|---|---|---|
| 5,807,774 A * | 9/1998 | Desu et al. ................... | 438/240 |
| 6,188,120 B1 * | 2/2001 | Andricacos et al. ......... | 257/532 |
| 6,211,035 B1 * | 4/2001 | Moise et al. ................. | 438/396 |
| 6,337,216 B1 | 1/2002 | Koo | |
| 6,344,413 B1 | 2/2002 | Zurcher et al. | |
| 6,368,910 B1 | 4/2002 | Sheu et al. | |
| 6,495,428 B1 | 12/2002 | Rhodes | |
| 6,605,835 B2 | 8/2003 | Lee | |
| 6,762,445 B2 * | 7/2004 | Ogawa et al. ................ | 257/296 |
| 2003/0112649 A1 | 6/2003 | Wouters et al. | |

FOREIGN PATENT DOCUMENTS

| | | |
|---|---|---|
| JP | 07-302888 | 11/1995 |
| JP | 10-189885 | 7/1998 |
| JP | 10-303377 | 11/1998 |
| JP | 11-121702 | 4/1999 |
| JP | 11-243181 | 9/1999 |
| JP | 11-317377 | 11/1999 |

(Continued)

OTHER PUBLICATIONS

Korean Office Action dated Jan. 13, 2006.

*Primary Examiner*—Hung Vu
(74) *Attorney, Agent, or Firm*—Buchanan Ingersoll & Rooney PC

(57) ABSTRACT

A ferroelectric capacitor comprises a first electrode comprising an alloy of Ir and Ru, a ferroelectric layer disposed on the first electrode, and a second electrode disposed on the ferroelectric layer. A ferroelectric memory comprises a substrate and a plurality of memory cells arranged on the substrate. Each memory cell comprises a first electrode comprising an alloy of Ir and Ru, a ferroelectric layer disposed on the first electrode, and a second electrode disposed on the ferroelectric layer.

23 Claims, 8 Drawing Sheets

FOREIGN PATENT DOCUMENTS

| | | | |
|---|---|---|---|
| JP | 2002-270785 | * | 9/2002 |
| KR | 10-1998-028587 | | 7/1998 |
| KR | 1998-028587 | | 7/1998 |
| KR | 10-1998-037162 | | 8/1998 |
| KR | 10-1998-040642 | | 8/1998 |
| KR | 1998-045801 | | 9/1998 |
| KR | 10-1999-005451 | | 1/1999 |
| KR | 10-1999-0057828 | | 7/1999 |
| KR | 10-1999-0075997 | | 10/1999 |
| KR | 1020000001040 A | | 1/2000 |
| KR | 1020030002093 A | | 1/2003 |

* cited by examiner

Ru0 / Ir100

Ru 0.8 / Ir 99.2

Ru 28.0 / Ir 72.0

Ru37.4 / Ir62.6

Ru42 / Ir58

Ru48.5 / Ir51.5

Ru73 / Ir27

Ru90 / Ir10

Ru100 / Ir0

FERROELECTRIC CAPACITOR AND FERROELECTRIC MEMORY WITH IR-RU ALLOY ELECTRODE AND METHOD OF MANUFACTURING THE SAME

BACKGROUND

1. Field of the Invention

The present invention relates to ferroelectric capacitors and ferroelectric memory. More particularly, the invention relates to an alloy composition for the bottom electrode of a ferroelectric capacitor, which can be used in a ferroelectric memory.

2. Background Information

Ferroelectric random access memory (FRAM) is a non-volatile memory that maintains stored data without the need for maintaining power to the device. A memory cell (also referred to as a storage node) of an FRAM commonly employs a ferroelectric capacitor having a bottom electrode, a top electrode and a ferroelectrode layer disposed therebetween. The ferroelectric layer is made of a ferroelectric material that exhibits spontaneous electric polarization that can be maintained in the absence of power and that can be reversed in direction by the application of an appropriate electric field. Thus, the polarization direction of the ferroelectric layer of a given memory cell corresponds to a data storage state.

FIG. 1 illustrates a conventional ferroelectric capacitor comprising an iridium (Ir) bottom electrode 102, a lead-zirconate-titanate (PZT) ferroelectric layer 104 and a top electrode 106. U.S. Patent Application Publication No. 2003/0112649 discloses a ferroelectric memory with a ferroelectric capacitor wherein the bottom electrode is an Ir layer or a ruthenium (Ru) layer. U.S. Pat. No. 6,368,910 discloses ferroelectric memories with ferroelectric capacitors wherein the bottom electrode of the capacitor is a platinum (Pt) layer, an Ir layer or a Ru layer. The entire contents of U.S. 2003/0112649 and U.S. Pat. No. 6,368,910 are incorporated herein by reference.

The present inventors have observed, however, that the use of a Pt layer, a Ir layer or a Ru layer as a bottom electrode results in a rough surface of a PZT ferroelectric layer deposited on the bottom electrode, a rougher surface of the PZT layer being indicative of relatively poorer film quality compared to smoother PZT surfaces. Such surface roughness is especially observed when the PZT ferroelectric layer is deposited by metal organic chemical vapor deposition (MOCVD) on Ir, Ru or Pt electrode layers. The relatively poorer film quality of PZT layers that have rougher surfaces can lead to decreased performance of a ferroelectric capacitor in the form of greater leakage current, for example, which can result in greater power consumption and/or poorer retention of stored information in a corresponding FRAM. Thus, greater thicknesses of the ferroelectric layer may be needed to achieve acceptable performance in such devices. In addition, in instances where it is desirable for the bottom electrode layer to comprise a conductive oxide, deposition of iridium oxide is difficult. Moreover, using Ir or Pt for the entire bottom electrode is costly due to the high cost of these metals.

SUMMARY OF THE INVENTION

In one aspect, an exemplary ferroelectric capacitor comprises a first electrode comprising an alloy of Ir and Ru, a ferroelectric layer disposed on the first electrode, and a second electrode disposed on the ferroelectric layer.

In another aspect, a ferroelectric memory comprises a substrate and a plurality of memory cells arranged on the substrate. Each memory cell comprises a first electrode comprising an alloy of Ir and Ru, a ferroelectric layer disposed on the first electrode, and a second electrode disposed on the ferroelectric layer.

In another aspect, a method of fabricating a ferroelectric capacitor comprises forming a first electrode comprising an alloy of Ir and Ru, forming a ferroelectric layer on the first electrode, and forming a second electrode on the ferroelectric layer.

In another aspect, a method of fabricating a ferroelectric memory comprises forming a plurality of memory cells on a substrate. Each memory cell includes a first electrode comprising an alloy of Ir and Ru, a ferroelectric layer disposed on the first electrode, and a second electrode disposed on the ferroelectric layer.

The alloy of the first electrode can be a multi-phase alloy, a first phase and a second phase of the multi-phase alloy each containing Ir and Ru.

BRIEF DESCRIPTION OF THE FIGURES

The above and other features and advantages of the present invention will become more apparent by the following description of exemplary embodiments thereof, to which the present invention is not limited, with reference to the attached figures. It is noted that not all possible embodiments of the present invention necessarily exhibit each and every, or any, of the advantages identified herein.

DESCRIPTION OF EXEMPLARY EMBODIMENTS

Figure 1:
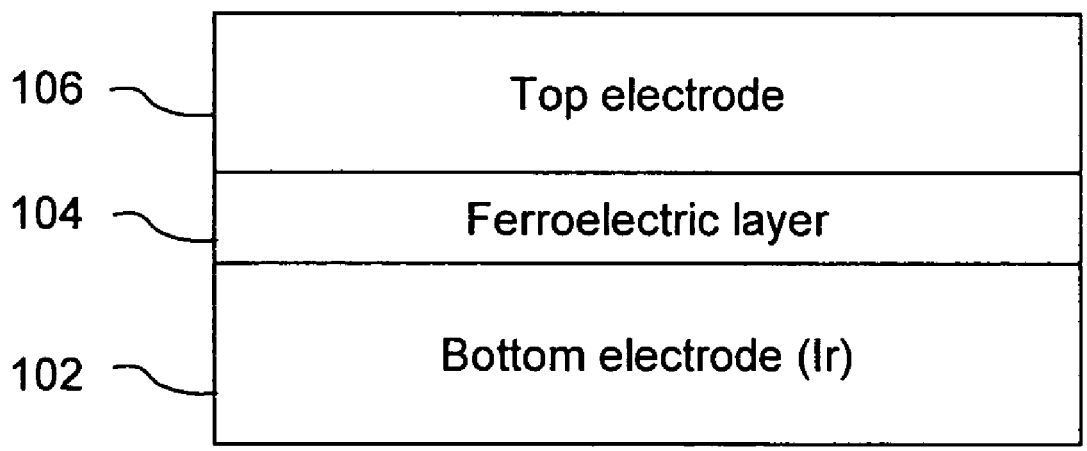
FIG. 1 is a schematic illustration of a conventional ferroelectric capacitor.
Figure 2:
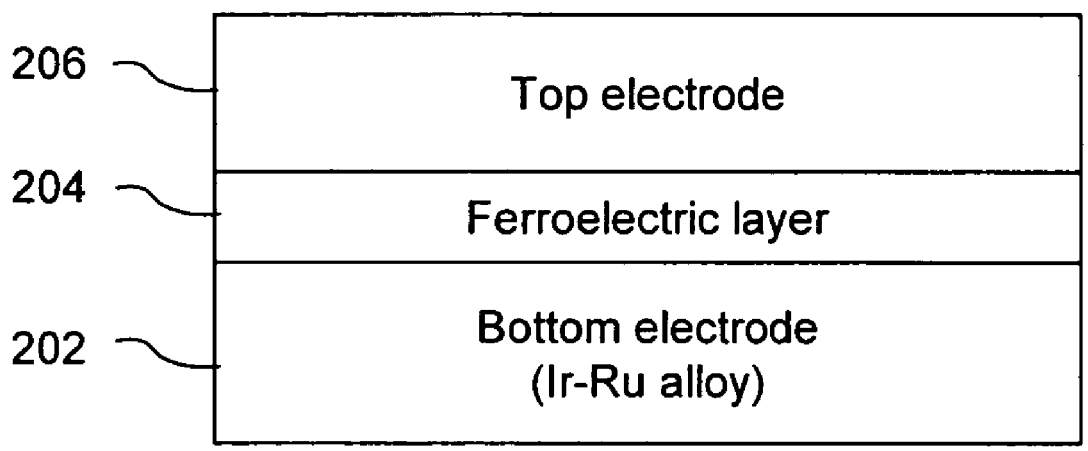
FIG. 2 is a schematic illustration of an exemplary ferroelectric capacitor.

In one embodiment, a ferroelectric capacitor is provided. FIG. 2 illustrates an exemplary ferroelectric capacitor 200. The ferroelectric capacitor 200 comprises a first electrode 202 (bottom electrode in the orientation shown) comprising an alloy of Ir and Ru. The ferroelectric capacitor 200 also comprises a ferroelectric layer 204 disposed on the first electrode 202 and a second electrode (top electrode in the orientation shown) 206 disposed on the ferroelectric layer 204.

The alloy of Ir and Ru can have an average composition of $Ru_xIr_{1-x}$ wherein x is in the range of 30 to 70% (atomic). In this regard, the average composition will be understood to mean a mixing ratio between Ir and Ru, considering that an Ir—Ru alloy formed in this composition range may be a multi-phase alloy comprising grains with different compositions, rather than a single phase alloy.

The alloy of Ir and Ru can be multi-phase alloy wherein a first phase and a second phase of the multi-phase alloy each contain Ir and Ru. The alloy of Ir and Ru used for electrode 202 can have an average composition of $Ru_xIr_{1-x}$ wherein x is in the range of 35 to 55 atomic percent, corresponding approximately to the boundaries of the multi-phase region between Ir-rich and Ru-rich solid solutions, such as illustrated by the Ir—Ru binary alloy phase diagram published in the ASM Handbook Volume 3: Alloy Phase Diagrams, 1992, ASM International, said phase diagram being incorporated herein by reference. An Ir—Ru alloy having an average Ru concentration in the range of 35-55% (corresponding to the multiphase region of the Ir—Ru binary phase diagram extrapolated to room temperature) is expected to be a mixture of grains of an alpha ($\alpha$) phase of an Ir-rich solid solution having a cubic structure and a beta ($\beta$) phase of an Ru-rich solid solution having a hexagonal closed packed (HCP) structure. Each grain has its own specific structure and composition. For instance, and by way of a non-limiting example, an $\alpha$ grain can have an average composition of $Ru_{35}Ir_{65}$ and a cubic structure, and a $\beta$ grain can have an average composition of $Ru_{55}Ir_{45}$ and a HCP structure. If an alloy of Ir and Ru is formed where Ir>>Ru, then Ru is simply dispersed in a matrix of Ir, forming a single-phase, Ir-rich solid solution. If, on the other hand, Ru>>Ir, then Ir is simply dispersed in a matrix of Ru, forming a single-phase, Ru-rich solid solution.

Preferably, the Ir—Ru alloy of the bottom electrode 202 has an average composition of $Ru_xIr_{1-x}$ where x is in the range of 35 to 50 atomic percent. More preferably, the Ir—Ru alloy of the bottom electrode 202 has an average composition of $Ru_xIr_{1-x}$ where x is in the range of 35 to 45 atomic percent. Even more preferably, the Ir—Ru alloy of the bottom electrode 202 has an average composition of about $Ru_{40}Ir_{60}$ (i.e., 40% Ru±2%). It should be understood that a bottom electrode 202 as disclosed herein can contain other constituents in addition to Ir and Ru. For example, additional metallic elements and/or non-metallic elements (e.g., oxygen) can be included in the bottom electrode 202, if desired, and such is contemplated as being within the scope of an electrode comprising an alloy of Ir and Ru. The bottom electrode 202 can be prepared by any suitable technique such as co-sputtering from separate targets onto a substrate (not shown), sputtering from a single alloy target, chemical vapor deposition (CVD), or atomic layer deposition, or by any other suitable technique including but not limited to those conventionally known to those of ordinary skill in the art.

The ferroelectric layer 204 can be any suitable material such as lead-zirconate-titanate (PZT) also referred to as $PbZrTiO_3$ (though not necessarily limited to that composition), strontium-bismuth-tantalate (SBT) also referred to as $SrBiTa_2O_9$ (though not necessarily at that composition), bismuth-lanthanum-titanate (BLT) also referred to as $(BiLa)_4Ti_3O_{12}$ (though not necessarily at that composition) or barium-strontium-titanate (BST) also referred to as $BaSrTiO_3$ (though not necessarily at that composition). The ferroelectric layer 204 can be prepared using any suitable technique such as sputtering, CVD (including metal organic CVD), with or without a post-anneal treatment in an oxygen atmosphere, or by another other suitable technique including but not limited to those conventionally known to those of ordinary skill in the art. The top electrode 206 can be any suitable electrically conducting material such as, for example, Al, Ir, $IrO_2$, combination of Ir and $IrO_2$, Ru, $RuO_2$, combination of Ru and $RuO_2$, Pt, or Ir—Ru alloy as described herein, and can be formed by any suitable techniques such as sputtering or CVD, for example. Any suitable thicknesses and lateral dimensions for the bottom electrode 202, the ferroelectric 204 and the top electrode 206 can be used, the choices of which can be made by one of ordinary skill in the art depending upon the desired use of the ferroelectric capacitor 200.

Figure 3A:
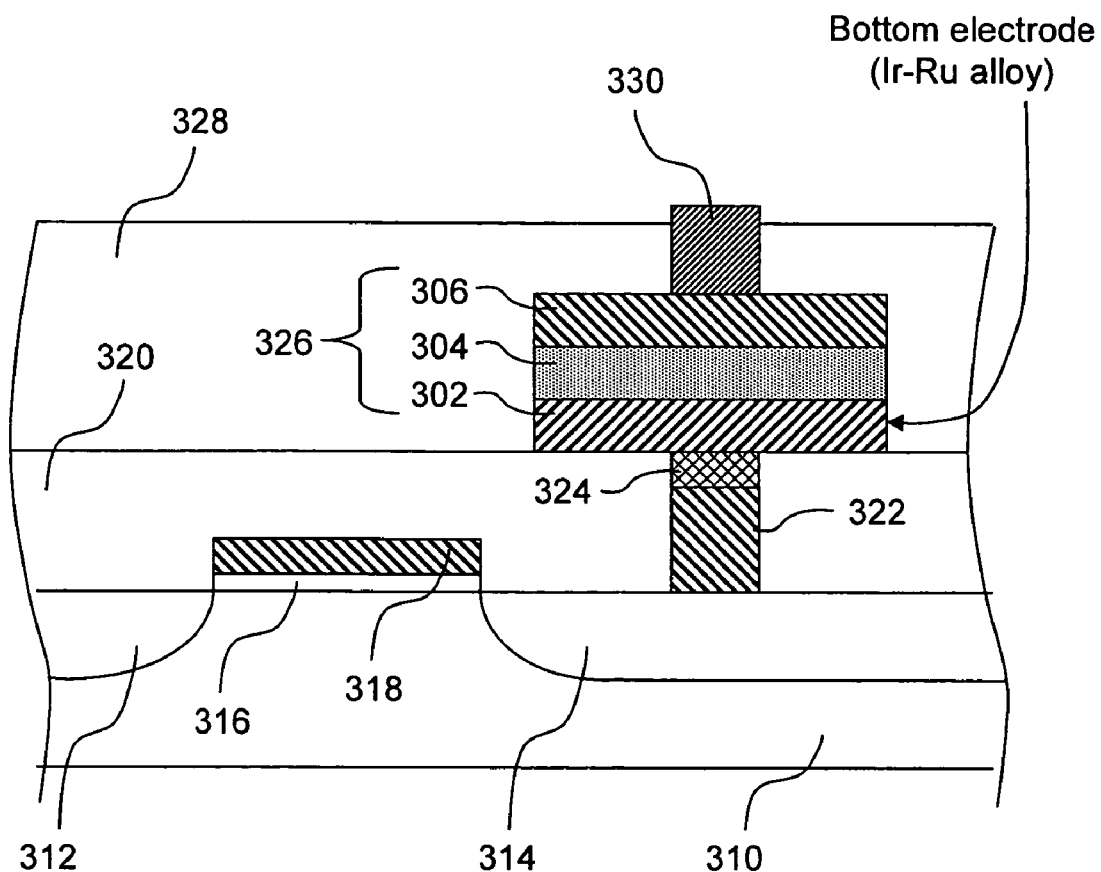
FIGS. 3A and 3B are schematic illustrations of exemplary ferroelectric memory cells.

In another embodiment, a ferroelectric memory comprising a substrate and a plurality of memory cells arranged on the substrate is provided, each memory cell including a first electrode comprising an alloy of Ir and Ru, a ferroelectric layer disposed on the first electrode, and a second electrode disposed on the ferroelectric layer. FIG. 3A illustrates a portion of an exemplary ferroelectric memory 300 in cross-sectional view for which an exemplary memory cell is shown. The memory cell is arranged on a substrate 310 and comprises a transistor structure and a ferroelectric capacitor structure. In particular, the transistor structure comprises a drain region 312 and a source region 314 arranged in the substrate 310 (e.g., a semiconductor substrate such as silicon), as well as a gate oxide 316 (e.g., $SiO_2$, $Ta_2O_5$, or other suitable insulator) and a gate electrode 318 (e.g., Al, Pt, W, or other suitable conducting material) disposed above and between the drain and source regions 312 and 314. A first insulating layer 320 (e.g., $SiO_2$ or other insulating material) surrounds the gate oxide 316 and the gate electrode 318.

The memory cell also includes a ferroelectric capacitor 326, such as that illustrated in FIG. 2, comprising a first electrode 302 (bottom electrode) comprising an alloy of Ir and Ru, a ferroelectric layer 304 disposed on the first electrode 302, and a second electrode 306 (top electrode) disposed on the ferroelectric layer 304. The ferroelectric layer 304 and the top electrode 306 can be formed of the same materials and compositions as those described for the ferroelectric capacitor 200 of FIG. 2, for example. The bottom electrode 302 can be formed of the same Ir—Ru alloy average compositions discussed above in connection with the ferroelectric capacitor 200 of FIG. 2, as can be the top electrode 306. A contact plug 322 (made of, e.g., W, Ru, $Ru/RuO_2$, TiN, polysilicon or any suitable conductor) makes electrical contact between the bottom electrode 302 and the source region 314. A plate line 330 (e.g., Al, Pt, or other suitable conductive material) makes electrical contact to the top electrode 306. A barrier layer 324 (made of, e.g, TiN, TiSiN, TiAlN) can also be provided, if desired, between the contact plug 322 and the bottom electrode 302. A second insulating layer 328 (e.g., $SiO_2$ or other insulating material) surrounds the ferroelectric capacitor 326 as illustrated. A word line (not shown) can be connected to the gate electrode 318, and a bit line (not shown) can be connected to the drain 312, as known to those of ordinary skill in the art. Any suitable thicknesses and lateral dimensions for the bottom electrode 302, the ferroelectric 304 and the top electrode 306 can be used, the choices of which can be made by one of ordinary skill in the art depending upon the desired performance specifications of the ferroelectric memory 300.

The ferroelectric memory 300 can be fabricated using conventional techniques known to those of ordinary skill in the art, such as disclosed, for example, in U.S. Pat. Nos. 6,337,216 and 6,605,835, each of which are incorporated herein by reference. For example, an insulating layer used to make the gate oxide 316 and a metallization layer used to the gate electrode can be deposited on the substrate 310 using any suitable deposition technique(s). Lithographic patterning and etching can then be carried out to define the gate electrodes 318 and the gate oxides 216. Ion-implantation can then be carried out using the gate electrodes 318 as a self-aligned mask, for instance, to form the source and drain regions 314 and 312 (with suitable masking to protect other areas from being implanted). Patterning and metallization can then be carried out to form word lines and bit lines connected to the gate electrodes 318 and source regions 314, respectively. An insulating material can then be deposited on the structure to form the first insulating layer 320, which can be processed by chemical-mechanical polishing (CMP) to provide a smooth surface.

Openings for the contact plugs 322 can then be formed in the insulating layer 320 by lithographic patterning and etching, and appropriate materials, such as those noted above, can be deposited by any suitable technique (e.g., sputtering, evaporation, CVD) to form the contact plugs 322 and the barrier layers 324. The insulating layer 320 with the plug and barrier materials deposited thereon can be further processed by CMP to produce a smooth surface. The ferroelectric capacitors 326 can then be formed on the surface of the insulating layer 320 (above the contact plugs 322) by techniques noted above. A second insulating layer 328 can then be deposited by any suitable technique (e.g., sputtering, CVD) to surround the ferroelectric capacitors 326. The surface of the second insulating layer 320 can then be processed by CMP, and the resulting surface can be patterned and etched to provide an openings for the plate lines 330 to contact the top electrodes 306. The plate lines 330 can be deposited by any suitable technique (e.g., sputtering, evaporation, CVD) to fill the openings for the plate lines 330.

Figure 3B:
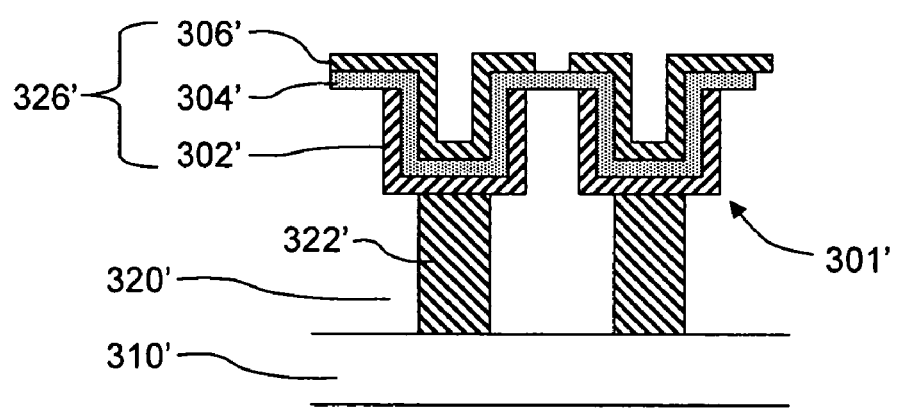
Figure 4A:
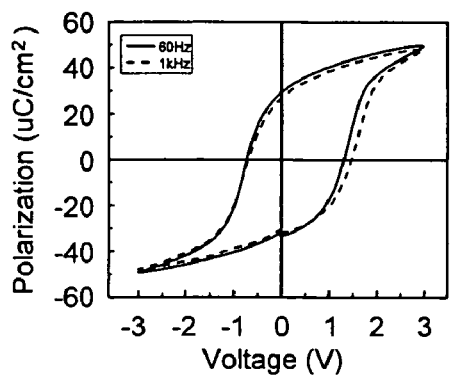
FIGS. 4A and 4B illustrate P-V hysteresis curves for a ferroelectric capacitor employing an Ir bottom electrode before and after a post anneal, respectively.
Figure 4B:
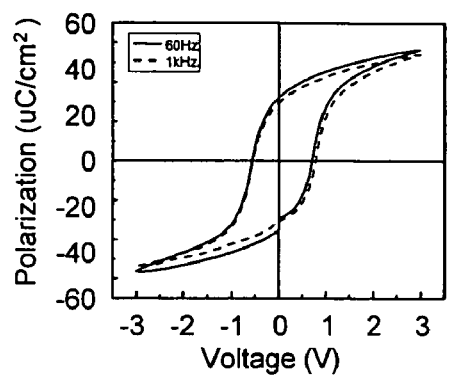
Figure 5A:
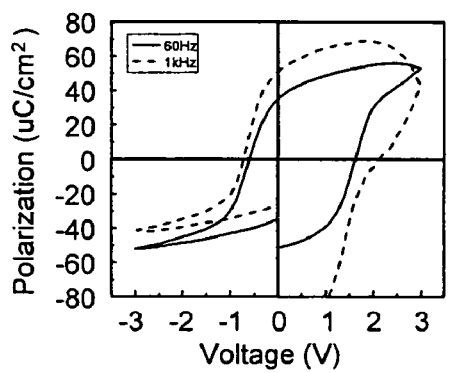
FIGS. 5A and 5B illustrate P-V hysteresis curves for an exemplary ferroelectric capacitor having a $Ru_{0.8}Ir_{99.2}$ electrode before and after a post anneal, respectively.
Figure 5B:
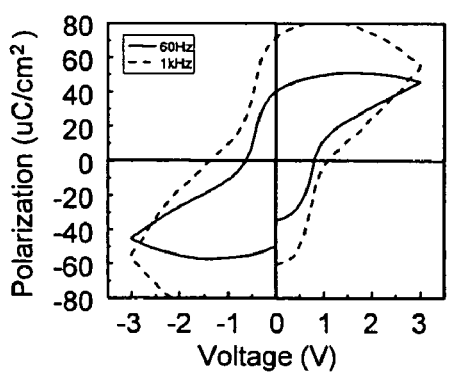
Figure 6A:
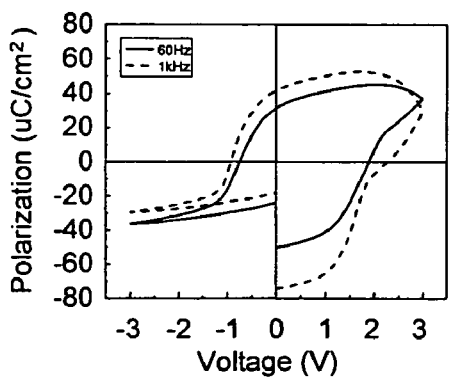
FIGS. 6A and 6B illustrate P-V hysteresis curves for a ferroelectric capacitor employing a $Ru_{28.0}Ir_{72.0}$ bottom electrode before and after a post anneal, respectively.
Figure 6B:
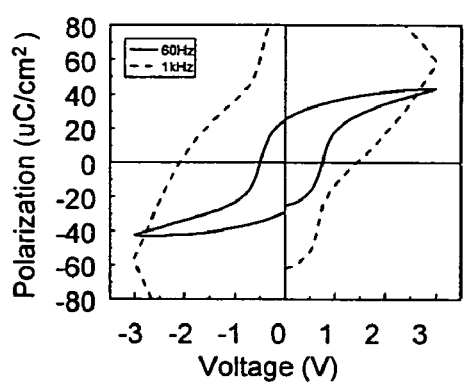
Figure 7A:
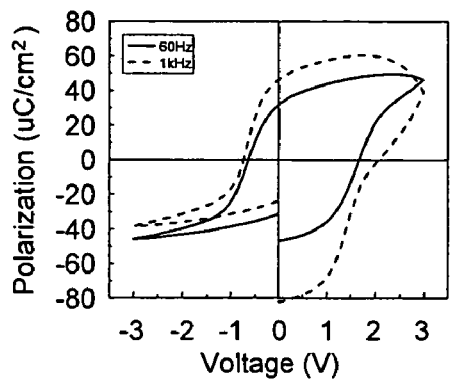
FIGS. 7A and 7B illustrate P-V hysteresis curves for an exemplary ferroelectric capacitor employing a $Ru_{37.4}Ir_{62.6}$ bottom electrode before and after a post anneal, respectively.
Figure 7B:
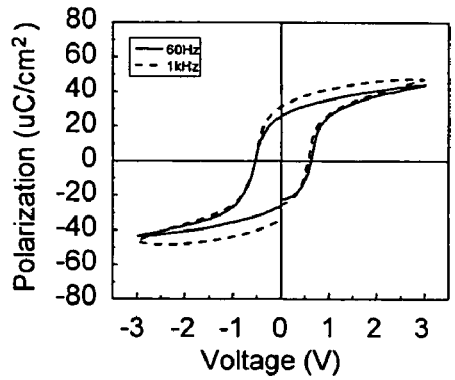
Figure 8A:
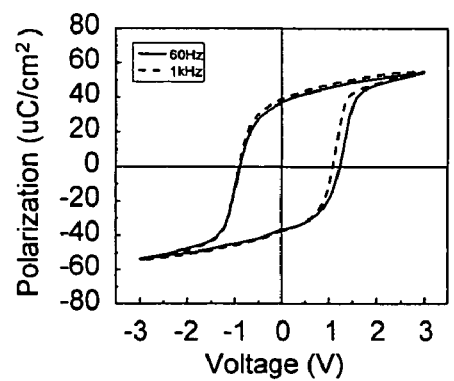
FIGS. 8A and 8B illustrate P-V hysteresis curves for an exemplary ferroelectric capacitor employing a $RU_{42}Ir_{58}$ bottom electrode before and after a post anneal, respectively.
Figure 8B:
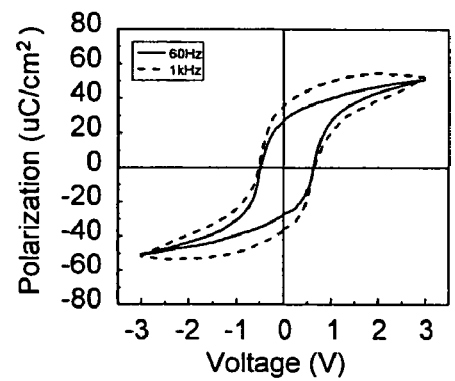
Figure 9A:
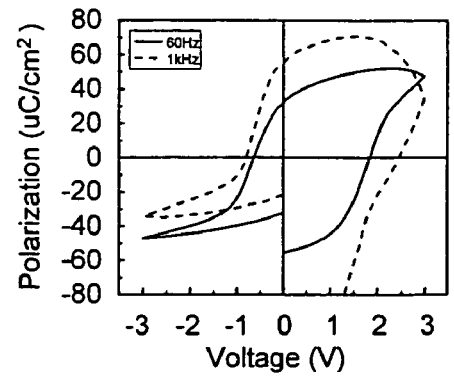
FIGS. 9A and 9B illustrate P-V hysteresis curves for an exemplary ferroelectric capacitor employing a $Ru_{48.5}Ir_{51.5}$ bottom electrode before and after a post anneal, respectively.
Figure 9B:
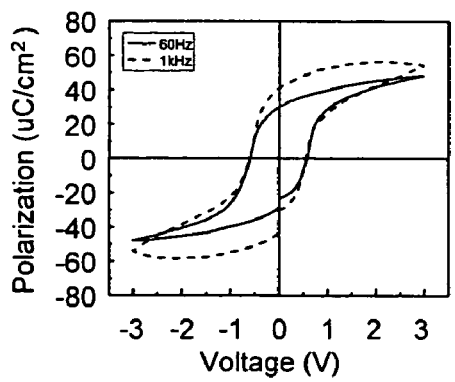
Figure 10A:
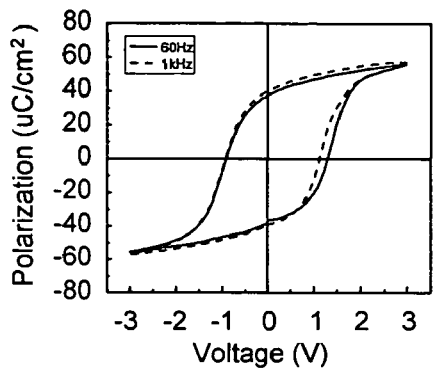
FIGS. 10A and 10B illustrate P-V hysteresis curves for an exemplary ferroelectric capacitor employing a $Ru_{73}Ir_{27}$ bottom electrode before and after a post anneal, respectively.
Figure 10B:
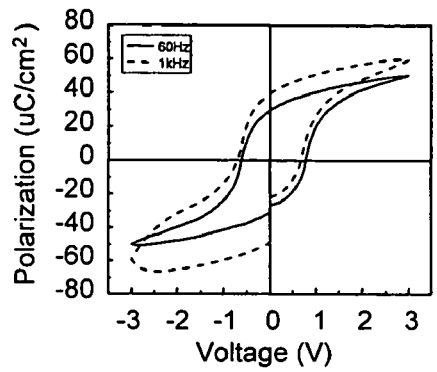
Figure 11A:
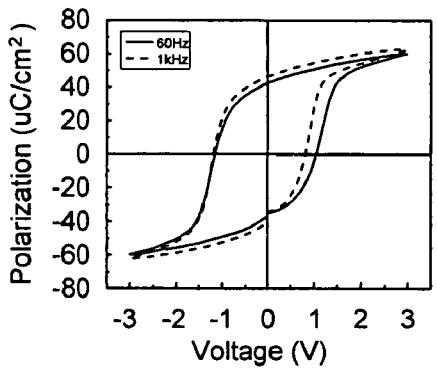
FIGS. 11A and 11B illustrate P-V hysteresis curves for an exemplary ferroelectric capacitor employing a $Ru_{90}Ir_{10}$ bottom electrode before and after a post anneal, respectively.
Figure 11B:
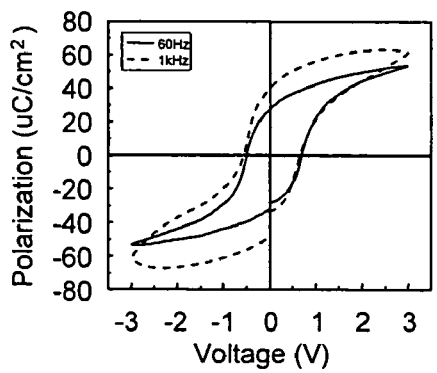
Figure 12A:
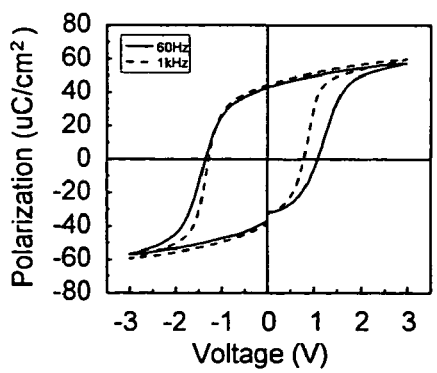
FIGS. 12A and 12B illustrate P-V hysteresis curves for a ferroelectric capacitor employing a Ru bottom electrode before and after a post anneal, respectively.
Figure 12B:
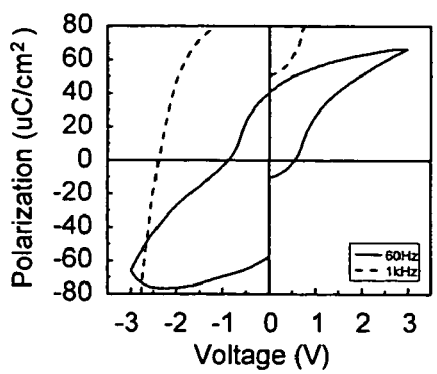

FIG. 3B illustrates an alternative to the ferroelectric capacitor 326 of the memory cell shown in FIG. 3A. The three dimensional ferroelectric capacitor 326' shown in FIG. 3B includes a first electrode 302' (bottom electrode) comprising an alloy of Ir and Ru, a ferroelectric layer 304' deposited on the first electrode 302' and a second electrode 306' (top electrode) deposited on the ferroelectric layer 304'. In contrast to the embodiment of FIG. 3A, however, the first and second electrodes 302', 306' and the ferroelectric layer 304' are formed on at least two side walls and the bottom of a trench 301', thereby creating greater capacitance area without enlarging the surface area occupied by an individual capacitor. The composition of these layers can be the same as depicted and described with reference to FIG. 3A and includes a contact plug 322' in a first insulating layer 320' that is positioned on a substrate 310'. Naturally, the transistor shown in FIG. 3A can be used in conjunction with its capacitor structure 326', or alternative circuit elements can be connected thereto.

It should be understood that the ferroelectric capacitors illustrated in FIGS. 3A and 3B and the resulting memory structure are intended to be illustrative and not restrictive. Ferroelectric capacitors having a bottom electrode comprising an alloy of Ir and Ru as disclosed herein can be employed in any type of FRAM configuration that utilizes ferroelectric capacitors, including both destructive read out (DRO) devices and non-destructive read out (NDRO) devices. For example, ferroelectric capacitors as disclosed herein can be employed in conventional FRAM configurations in which a ferroelectric capacitor is positioned at the gate of a transistor, the bottom electrode being disposed on the gate oxide.

Preferred mixing ratios of Ir and Ru for the bottom electrode 202/302 were determined in part from atomic force microscopy (AFM) measurements and polarization hysteresis measurements of ferroelectric capacitor samples prepared at a variety of Ir—Ru mixing ratios. More particularly, a number of ferroelectric capacitor samples were fabricated by sputtering bottom electrodes on $SiO_2$ substrates by sputtering, including one sample with a bottom electrode of 100 percent Ir and another sample with a bottom electrode of 100 percent Ru. Other bottom electrodes were deposited by co-sputtering Ir and Ru from separate sputtering sources. PZT ferroelectric layers were deposited on the bottom electrodes by a metal-organic chemical vapor deposition (MOCVD) followed by a post-anneal in an oxygen atmosphere at 600 degrees C. The bottom electrode layers had a thickness of approximately 100 nm, and the PZT ferroelectric layers had thicknesses of approximately 100 nm.

The surfaces of both electrode-material films (~100 nm in thickness) and of PZT films (~100 nm in thickness) grown on such electrode layers on were characterized by AFM. Results of AFM measurements on electrode-material surfaces and PZT-layer surfaces are summarized in Table I in terms of average surface roughness, RMS surface roughness, and peak-valley surface roughness. As reflected in Table I, particularly good results for RMS surface roughness of the PZT layer were obtained for bottom electrodes having average ruthenium compositions of 37.4%, 42%, and 48.5%, which lie within the multi-phase region of the Ir—Ru binary alloy system. Moreover, qualitative visual observation of the AFM images indicated that relatively smaller and more uniform grain sizes were observed in PZT layers grown on bottom electrodes having average ruthenium compositions of 37.4% and 42%. Similarly, qualitative visual observation of AFM images obtained from bottom electrode surfaces revealed that the bottom electrode having an average ruthenium composition of 42% had relatively smaller and more uniform grains than the surfaces of other bottom electrode samples.

TABLE I

| | Surface Roughness (nm) Electrode Surface | | | Surface Roughness (nm) PZT Surface | | |
| --- | --- | --- | --- | --- | --- | --- |
| % Ru | Average | Peak–Valley | RMS | Average | Peak–Valley | RMS |
| 0 | 0.38 | 4.14 | 0.48 | 4.99 | 48.4 | 6.30 |
| 0.8 | 0.17 | 1.97 | 0.21 | 5.06 | 44.3 | 6.24 |
| 28 | 0.19 | 2.65 | 0.23 | 4.77 | 41.0 | 5.97 |
| 37.4 | 0.25 | 3.31 | 0.32 | 4.56 | 50.0 | 5.90 |
| 42 | 0.35 | 4.37 | 0.45 | 4.20 | 35.4 | 5.22 |
| 48.5 | 0.32 | 4.32 | 0.41 | 4.11 | 42.2 | 5.25 |
| 73 | 0.29 | 3.96 | 0.38 | 6.47 | 60.3 | 8.10 |
| 90 | 0.26 | 3.34 | 0.33 | 6.13 | 52.9 | 7.71 |
| 100 | 0.47 | 5.42 | 0.56 | 6.86 | 61.4 | 8.69 |

Figure 16:
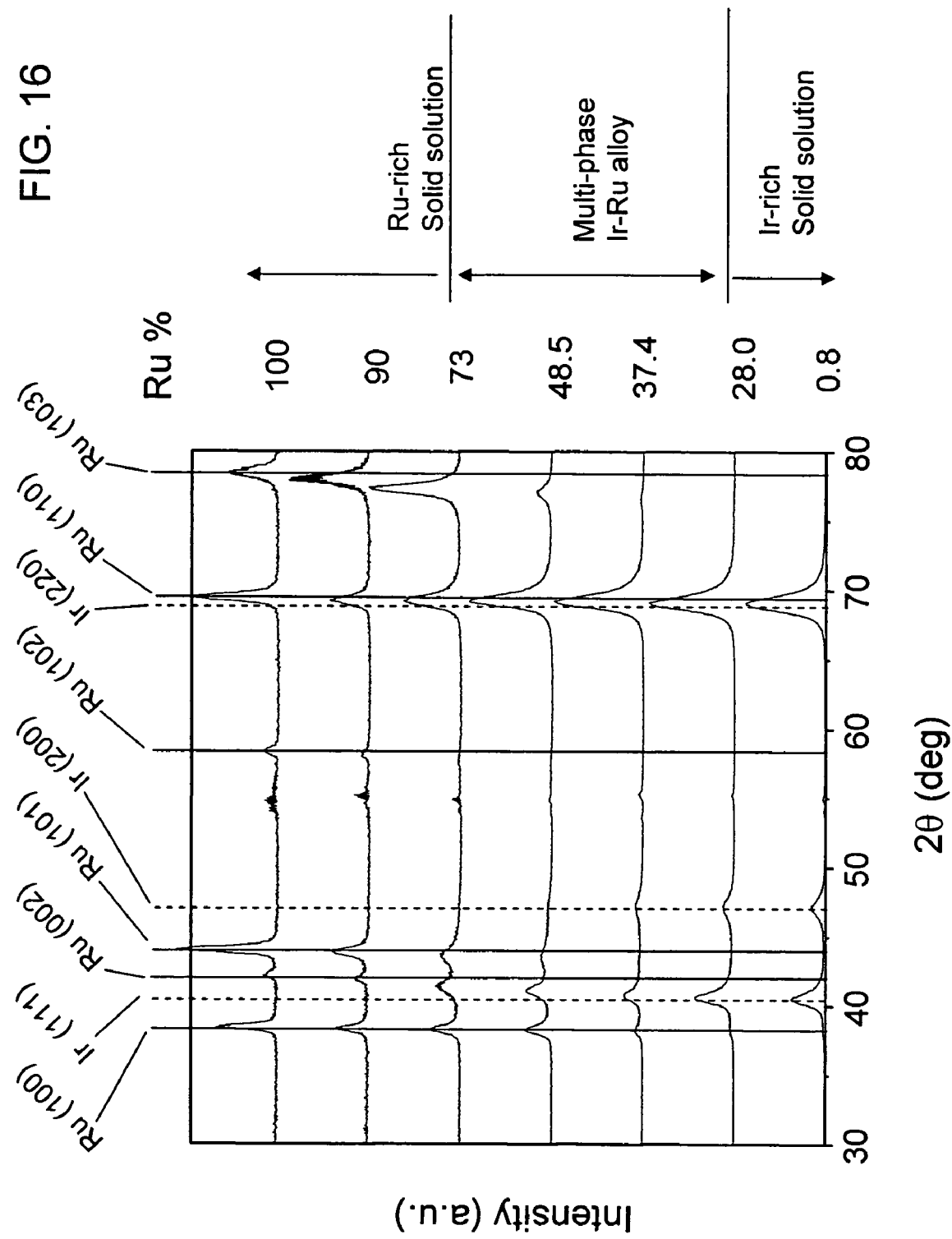
FIG. 16 illustrates x-ray diffraction data for Ir—Ru alloy samples of various average compositions.

In addition, x-ray diffraction measurements were made of the electrode-material films referred to in Table I, and this data is shown in FIG. 16. The diffraction measurements were obtained using Cu Kα radiation (1.5405 angstrom wavelength). As shown in FIG. 16, multi-phase Ir—Ru alloys were obtained for several of the electrode-material film samples, namely, those having average Ru concentrations of 28.0%, 37.4%, and 48.5%. The electrode-material film having an average Ru concentration of 0.8% exhibited an x-ray diffraction pattern consistent with that of an Ir-rich solid solution. In addition, the electrode-material films having average ruthenium concentrations of 73% and 90% exhibited x-ray diffraction patterns consistent with that of a Ru-rich solid solution. Thus, multi-phase Ir—Ru alloy films were obtained for average compositions lying within the multi-phase region of the Ir—Ru equilibrium phase diagram. In addition, multi-phase alloy material was obtained outside the multi-phase region identified by the equilibrium phase diagram, e.g., at the Ir-rich side of the multi-phase region. As discussed elsewhere herein, it is believed that grains of multi-phase material which are nucleated during growth of the Ir—Ru bottom electrode can prevent substantial grain growth of any given alloy phase, thereby providing smaller and more uniform grains. It is believed that the smaller and more uniform grains can lead to a smoother surface of a ferroelectric layer grown on such an electrode layer.

In addition, polarization-voltage hysteresis curves were measured both before and after a post-anneal treatment for each of the above-noted samples. Results of these measurements are shown in FIGS. 4A-12B. As known to those of ordinary skill in the art blunt end points of such hysteresis curves, as opposed to sharper end points, are indicative of depolarization and current leakage in the ferroelectric layer. In addition, discontinuities at zero voltage in the hysteresis curves are indicative of depolarization due to incomplete compensation and screening of charges. As reflected in FIGS. 4A-12B, particularly good ferroelectric performance was obtained for samples grown with bottom electrodes having average ruthenium compositions of 37.4 percent and 42 percent. Other post-anneal samples prepared with bottom electrodes having average ruthenium compositions of 28 percent, 48.5 percent, 73 percent and 90 percent also had good ferroelectric performance.

Post-annealing is generally employed in order to provide a good interface between a metallic electrode and PZT material. In many cases, the PZT-based capacitors suffer from imprint (i.e., a shift in the hysteresis loop) and high coercive field if no post annealing is performed. It is believed that this is due to poor contact between the top electrode and the PZT layer. When there is either an etching step after the top electrode deposition or passivation process with hydrogen, a post-annealing step with oxygen as generally performed for the purpose of compensating any damage to the PZT layer in certain areas especially around the perimeter of the capacitor, for example. Post-annealing can be performed in a suitable manner as known to those of ordinary skill in the art, e.g., typically 600° C. for 1 or 2 minutes by rapid thermal annealing (RTA) under a continuous flow of oxygen.

Figure 13:
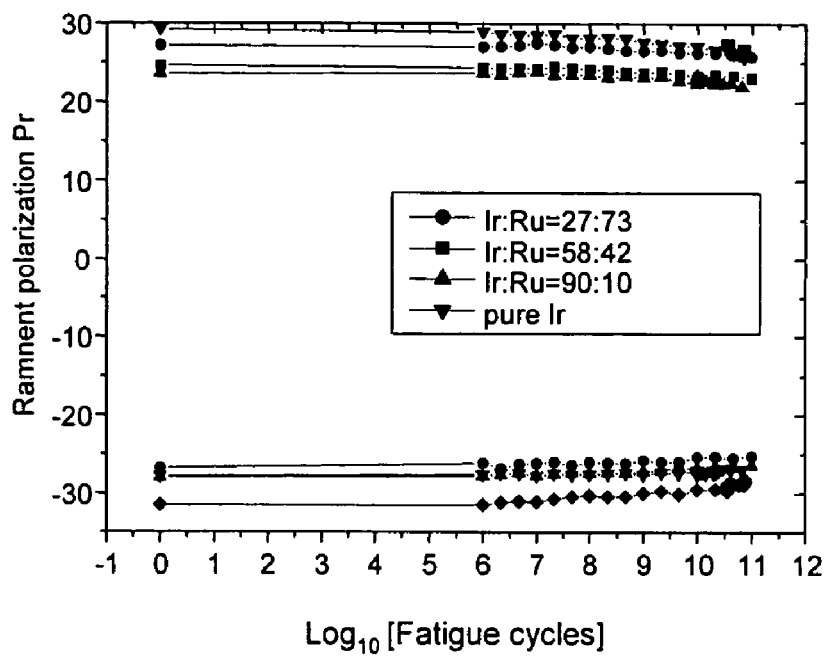
FIG. 13 shows measurement results of remnant polarization for four ferroelectric capacitors having different bottom-electrode compositions as a function of the number of fatigue cycles.

In addition, the fatigue properties of several ferroelectric capacitor samples having Ir—Ru alloy bottom electrodes were measured. In particular, as shown in FIG. 13, remnant polarization was measured for three samples as well as a sample having a pure Ir bottom electrode as a function of fatigue cycles. The results of those measurements are summarized in FIG. 14 which illustrates the percent of positive and negative remnant polarization retained after $10^{11}$ fatigue cycles as a function of bottom electrode average composition.

Figure 14:
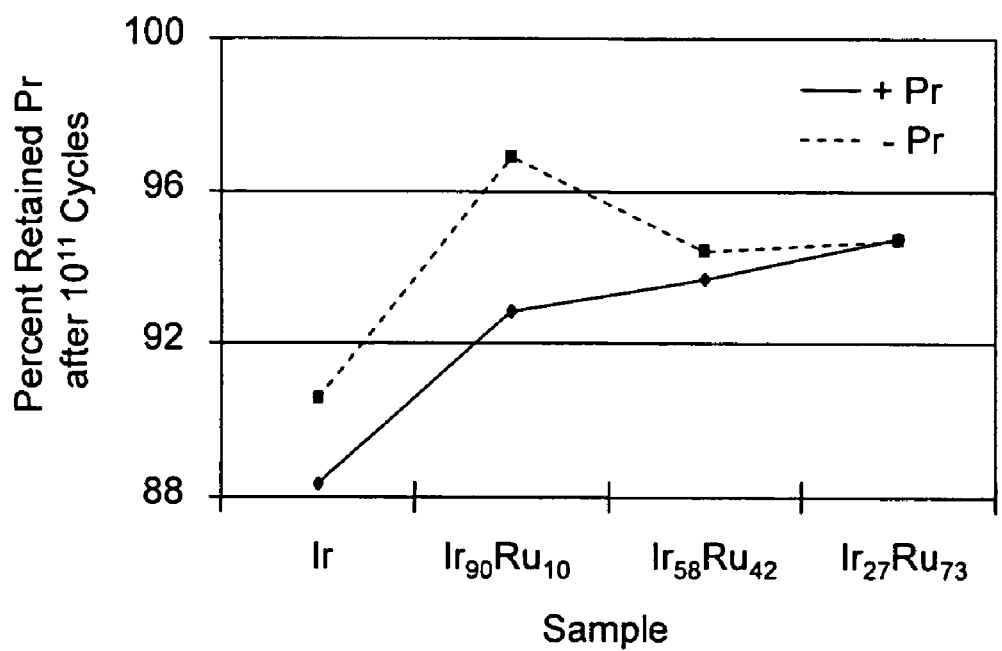
FIG. 14 shows remnant polarization ratios for the fatigued samples referred to in FIG. 13.

As reflected in FIG. 14, good results were obtained for samples having Ir—Ru alloy bottom electrodes as compared to the sample having a pure iridium bottom electrode.

In view of the above, ferroelectric capacitors having Ir—Ru alloy bottom electrodes as described herein, and FRAM employing such ferroelectric capacitors, can have advantages over conventional devices that utilize bottom electrodes made of pure Ir, Ru or Pt. First, the use of an Ir—Ru alloy bottom electrode can result in the growth of a ferroelectric layer thereon having a smoother surface and a smaller, more uniform grain size. In particular, for Ir—Ru alloys with average Ru concentrations of 35-55%, it is believed that grains of multiple phases are nucleated during growth of such bottom electrodes and that such nucleation prevents substantial grain growth of any given phase. Consequently, a ferroelectric layer grown on such bottom electrodes can also have smaller and more uniform grains, which leads to a smoother surface of the ferroelectric layer. The ability to provide smoother surfaces for ferroelectric layers enables the ability to make thinner ferroelectric layers, which further enables the ability to increase the density of ferroelectric memory cells on a given memory chip. Thus, the use of Ir—Ru alloy bottom electrodes as disclosed herein can be beneficial for increasing storage density in FRAM.

In addition, because the presence of multiple phases in the bottom electrode can restrict grain growth in the bottom electrode in certain embodiments, it is believed that a wider process window is allowed in terms of both processing temperatures and materials compositions for the ferroelectric layer.

In addition, the use of Ir—Ru alloy bottom electrodes in ferroelectric capacitors as described herein can provide a reduction of leakage current and a reduction in fatigue compared to conventional ferroelectric capacitors having pure Ir or pure Ru bottom electrodes. Further, the use of an Ir—Ru alloy for the bottom electrode provides a cost advantage compared to the use of using expensive pure Ir for the bottom electrodes.

Figure 15:
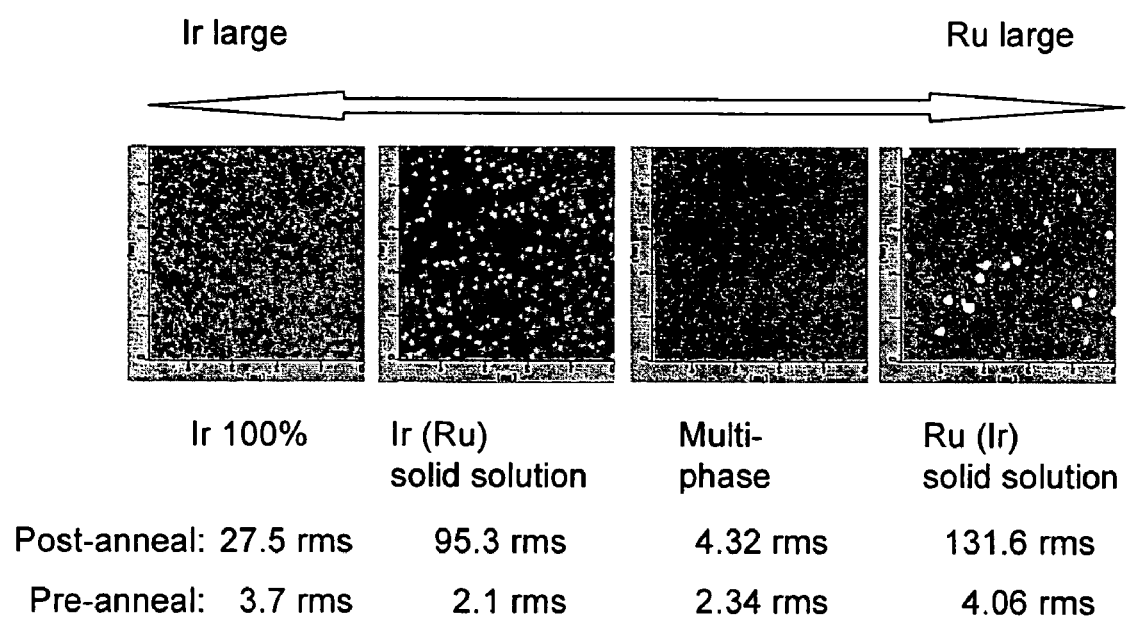
FIG. 15 illustrates high resistance against high thermal annealing around oxygen.

In addition, where it is desired to include an oxide portion in the bottom electrode, it is believed that Ir—Ru alloy electrodes can provide for more predictable oxidation behavior of such electrodes. In particular, x-ray photoelectron spectroscopy (XPS) measurements carried out on a sample of $Ru_{38}Ir_{62}/PZT$ grown on a $SiO_2$ substrate revealed a higher content of oxygen in the $Ru_{38}Ir_{62}$ alloy layer as compared to a similar layer of pure Ru. This suggests that reactivity to oxygen may be enhanced in the Ir—Ru alloy electrodes, which may lead to more predictable oxidation behavior and greater control of oxide formation, if desired, in such electrodes. This can be beneficial because the presence of such oxygen in the alloy can reduce diffusion of oxygen out of the adjacent PZT layer because the oxygen concentration gradient is smaller. This reduced diffusion reduces oxygen vacancies in the adjacent PZT layer that might otherwise occur and that might cause deleterious effects (e.g., increased fatigue and retention loss). In other words, such an oxygen-containing Ru—Ir alloy can further stabilize the adjacent PZT layer. FIG. 15 illustrates AFM images of four different samples that contain surface oxide resulting from annealing in oxygen (pure Ir, Ir-rich Ir—Ru alloy, multiphase Ir—Ru alloy and Ru-rich Ir—Ru alloy) and illustrates that the multiphase sample (~Ru:Ir 40:60 composition) has relatively high resistance against grain growth clustering during thermal annealing in oxygen. It is believed that the oxide layers are less than about 10 nm thick. The specific oxide stoichiometry is unresolved (e.g., whether the oxide is one or a combination of $RuO_x$, $IrO_x$ and/or $IrRuO_x$ is not determined in these images).

It is known that Ir—Ru compositions can form multiphase alloys wherein there is a coexistence of Ir (cubic) and Ru (HCP) phases. Surface oxidation of electrodes generally can result in rougher surface after thermal treatment, increase in sheet resistance, and changes in the grain nucleation of PZT deposited thereon. FIG. 15 illustrates much rougher surfaces and cluster growth in the first, second and fourth images from the left (pure Ir, Ir-rich Ir—Ru alloy, and Ru-rich Ir—Ru alloy, respectively) compared to the multiphase composition shown in the third image (~$Ru_{40}Ir_{60}$). Clusters (the bright spots) have sizes in the range of 10 nm in height or higher in FIG. 15. Only the surface of the multiphase Ir—Ru alloy with the composition of about Ru:Ir 40:60 (the third image) remained almost constant under high thermal treatment with oxygen.

It is believed that the surface oxide layer in the third case was the thinnest because the roughness appears to get higher as the thickness of the oxide layer increases, based on previous observations. In addition, the alloy illustrated in the third image is believed to contain some oxygen throughout the alloy, which can have beneficial stabilizing effects on the adjacent PZT layers as noted above. FIG. 15 illustrates something different than Table 1. The thermal annealing conducted to produce the images of FIG. 15 was done with pure Ir and several Ir—Ru electrode compositions. The annealing was conducted wherein these electrodes had free surface contact with oxygen gas. This is done, as explained elsewhere, during an additional annealing after the electrode deposition in order to make the film dense and to have a good texture. If an electrode is deposited by a chemical reaction method such as CVD or ALD in order to cover concave or convex structures that provide larger capacitor areas, the annealing step with oxide is desirable to remove remnant chemicals from the electrode. Thus, even under high temperature annealing, the robustness of the electrode sustaining a smooth surface is evident from the third illustration of FIG. 15. This is distinct from the oxidation states that might be formed inside the Ir—Ru electrodes during the PZT deposition. As noted above, if the electrode were oxidized suitably, the oxidation would tend to block oxygen escaping from the octahedral structure of the PZT layer during formation of the PZT layer, and prevent oxygen vacancies from being left inside the PZT lattice. Hence, the images in FIG. 15 illustrate that the present invention can be beneficial especially for providing greater reliability of the PZT layer such that the capacitor is more robust in terms of fatigue and retention loss. An electrode which does not have an oxidation state in it, such as Ru, may be more susceptible to oxygen diffusion so that the diffusion of oxygen out of an adjacent PZT layer is expected to be somewhat worse with such an electrode. Self-oxidation and regulation in the amount of oxidation can be further advantages of an Ir—Ru alloy in accordance with the present invention.

The embodiments described herein are merely illustrative and should not be considered restrictive in any way. The scope of the invention is given by the appended claims rather than the preceding description and all variations and equivalents which fall within the range of the claims are intended to be embraced therein.

What is claimed is:

1. A ferroelectric capacitor, comprising:
  a first electrode comprising an alloy of Ir and Ru, wherein the alloy is a multi-phase alloy with a first phase containing Ir and Ru and a second phase containing Ir and Ru;
  a ferroelectric layer disposed on the first electrode; and
  a second electrode disposed on the ferroelectric layer,
  wherein the alloy has a mixture of grains of an alpha ($\alpha$) phase of an Ir-rich solid solution and a beta ($\beta$) phase of a Ru-rich solid solution.

2. The ferroelectric capacitor of claim 1, wherein the $\alpha$ phase has a cubic structure and the $\beta$ phase has a hexagonal close packed structure.

3. The ferroelectric capacitor of claim 1, wherein the alloy has an average composition of about $Ru_{40}Ir_{60}$.

4. The ferroelectric capacitor of claim 1, wherein the ferroelectric layer comprises one of lead-zirconate-titanate, strontium-bismuth-tantalate, bismuth-lanthanum-titanate and barium-strontium-titanate.

5. The ferroelectric capacitor of claim 1, wherein the alloy has an average composition of $Ru_xIr_{1-x}$, x being in the range of about 37.4 to about 42 atomic percent.

6. A ferroelectric capacitor, comprising:
  a first electrode comprising an alloy of Ir and Ru wherein the alloy has an average composition of $Ru_xIr_{1-x}$, x being in the range of 35 to 45 atomic percent;
  a ferroelectric layer disposed on the first electrode; and
  a second electrode disposed on the ferroelectric layer,
  wherein the alloy is a multi-phase alloy, a first phase and a second phase of the multi-phase alloy each containing Ir and Ru,
  wherein the alloy has a mixture of grains of an alpha ($\alpha$) phase of an Ir-rich solid solution and a beta ($\beta$) phase of a Ru-rich solid solution.

7. The ferroelectric capacitor of claim 6, wherein the $\alpha$ phase has a cubic structure and the $\beta$ phase has a hexagonal close packed structure.

8. A ferroelectric capacitor, comprising:
  a first electrode comprising an alloy of Ir and Ru wherein the alloy has an average composition of $Ru_xIr_{1-x}$, x being in the range of 35 to 45 atomic percent;
  a ferroelectric layer disposed on the first electrode; and
  a second electrode disposed on the ferroelectric layer,
  wherein a root mean square (RMS) of a surface roughness of a surface of the ferroelectric layer is less than about 5.9 nm.

9. A ferroelectric memory, comprising:
  a substrate; and
  a plurality of memory cells arranged on the substrate, each memory cell comprising:
    a first electrode comprising an alloy of Ir and Ru, wherein the alloy is a multi-phase alloy with a first phase and a second phase of the multi-phase alloy each containing Ir and Ru,
    a ferroelectric layer disposed on the first electrode, and
    a second electrode disposed on the ferroelectric layer,
  wherein a root mean square (RMS) of a surface roughness of a surface of the ferroelectric layer is less than about 5.9 nm.

10. The ferroelectric memory of claim 9, wherein the alloy has a mixture of grains of an alpha ($\alpha$) phase of an Ir-rich solid solution and a beta ($\beta$) phase of a Ru-rich solid solution, and wherein $\alpha$ phase has a cubic structure and the $\beta$ phase has a hexagonal close packed structure.

11. The ferroelectric memory of claim 9, wherein the alloy has an average composition of about $Ru_{40}Ir_{60}$.

12. The ferroelectric memory of claim 9, wherein the ferroelectric layer comprises one of lead-zirconate-titanate, strontium-bismuth-tantalate, bismuth-lanthanum-titanate and barium-strontium-titanate.

13. The ferroelectric memory of claim 9, further comprising a barrier layer disposed at a surface of the second electrode, the second electrode being arranged between the barrier layer and the ferroelectric layer.

14. A ferroelectric memory, comprising:
a substrate; and
a plurality of memory cells arranged on the substrate, each memory cell comprising
a first electrode comprising an alloy of Ir and Ru,
a ferroelectric layer disposed on the first electrode, and
a second electrode disposed on the ferroelectric layer,
wherein the alloy is a multi-phase alloy, a first phase and a second phase of the multi-phase alloy each containing Ir and Ru,
wherein the alloy has a mixture of grains of an alpha ($\alpha$) phase of an Ir-rich solid solution and a beta ($\beta$) phase of a Ru-rich solid solution.

15. The ferroelectric memory of claim 14, wherein the $\alpha$ phase has a cubic structure and the $\beta$ phase has a hexagonal close packed structure.

16. A ferroelectric memory, comprising:
a substrate; and
a plurality of memory cells arranged on the substrate, each memory cell comprising
a first electrode comprising an alloy of Ir and Ru,
a ferroelectric layer disposed on the first electrode, and
a second electrode disposed on the ferroelectric layer,
further comprising a surface oxide layer with a thickness of less than about 10 nm on the first electrode,
wherein the alloy has a mixture of grains of an alpha ($\alpha$) phase of an Ir-rich solid solution and a beta ($\beta$) phase of a Ru-rich solid solution.

17. A ferroelectric memory, comprising:
a multiphase $Ru_{40}Ir_{60}$ alloy first electrode, wherein the first electrode further comprises oxygen within the alloy;
a ferroelectric layer disposed on the first electrode; and
a second electrode disposed on the ferroelectric layer,
wherein the alloy has a mixture of grains of an alpha ($\alpha$) phase of an Ir-rich solid solution and a beta ($\beta$) phase of a Ru-rich solid solution.

18. The ferroelectric memory of claim 17, wherein a root mean sguare (RMS) of a surface roughness of a surface of the ferroelectric layer is less than about 5.9 nm.

19. The ferroelectric memory of claim 17, wherein the $\alpha$ phase has a cubic structure and the $\beta$ phase has a hexagonal close packed structure.

20. The ferroelectric memory of claim 17, wherein the ferroelectric layer comprises one of lead-zirconate-titanate, strontium-bismuth-tantalate, bismuth-lanthanum-titanate and barium-strontium-titanate.

21. The ferroelectric memory of claim 17, further comprising a barrier layer disposed at a surface of the second electrode, the second electrode being arranged between the barrier layer and the ferroelectric layer.

22. A ferroelectric capacitor, comprising:
a first electrode comprising an alloy of Ir and Ru wherein the alloy has an average composition of $Ru_xIr_{1-x}$, x being in the range of 35 to 45 atomic percent;
a ferroelectric layer disposed on the first electrode; and
a second electrode disposed on the ferroelectric layer,
further comprising a surface oxide layer with a thickness of less than about 10 nm on the first electrode,
wherein the alloy has a mixture of grains of an alpha ($\alpha$) phase of an Ir-rich solid solution and a beta ($\beta$) phase of a Ru-rich solid solution.

23. The ferroelectric memory of claim 22, wherein a root mean square (RMS) of a surface roughness of a surface of the ferroelectric layer is less than about 5.9 nm.

* * * * *